United States Patent
Vashchenko et al.

(10) Patent No.: US 7,973,386 B1
(45) Date of Patent: Jul. 5, 2011

(54) ESD PROTECTION BIPOLAR DEVICE WITH INTERNAL AVALANCHE DIODE

(75) Inventors: Vladislav Vashchenko, Palo Alto, CA (US); Vladimir Kuznetsov, Santa Clara, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 87 days.

(21) Appl. No.: 11/652,982

(22) Filed: Jan. 12, 2007

(51) Int. Cl.
*H01L 29/66* (2006.01)
(52) U.S. Cl. ............ 257/565; 257/E27.053; 438/5
(58) Field of Classification Search .......... 257/565, 257/E27.053; 438/5
See application file for complete search history.

(56) References Cited

U.S. PATENT DOCUMENTS

| | | | |
|---|---|---|---|
| 4,766,469 A * | 8/1988 | Hill ..................... | 257/551 |
| 5,148,255 A * | 9/1992 | Nakazato et al. ........ | 257/378 |
| 5,298,788 A * | 3/1994 | Moreau ................. | 257/606 |
| 5,751,054 A * | 5/1998 | Yilmaz et al. ......... | 257/603 |
| 2004/0207965 A1* | 10/2004 | Ausserlechner ......... | 361/56 |
| 2004/0212043 A1* | 10/2004 | Garnett et al. ........ | 257/558 |

* cited by examiner

*Primary Examiner* — Thao X Le
*Assistant Examiner* — Matthew Gordon
(74) *Attorney, Agent, or Firm* — Jurgen K. Vollrath

(57) ABSTRACT

In a bipolar device an intrinsic Zener like diode is formed for controlling the triggering voltage and leakage current, the Zener-like diode being formed between the n-collector and the p-base, wherein the collector implant and base diffusion overlap at least partially.

1 Claim, 4 Drawing Sheets

ESD PROTECTION BIPOLAR DEVICE WITH INTERNAL AVALANCHE DIODE

FIELD OF THE INVENTION

The invention relates to low snapback voltage ESD protection devices. In particular, it relates to bipolar ESD protection devices such as bipolar junction transistors (BJTs) and bipolar SCRs (BSCRs).

BACKGROUND OF THE INVENTION

The breakdown voltage of bipolar devices such as NPN BJTs is rather high. In order to achieve the appropriate breakdown voltage in such devices so as to provide ESD protection in the desired voltage domain one prior art solution has been to provide a reference current at a certain reference voltage by introducing a voltage reference device into the base-collector circuit of the bipolar device, thereby providing what is also referred to as an enhanced Zener clamp in the case of a Zener diode as reference device. At a reference voltage that exceeds the breakdown voltage of the reference device (whether it be a Zener or a diode or stacked diode arrangement), base current is produced which triggers the NPN BJT or BSCR ESD device.

However, this prior art solution requires not only extensive experimentation with the breakdown characteristics of the reference device, it also requires additional space on the chip to accommodate the reference device. A schematic representation of a BJT 100 with a Zener reference device 102 is shown in FIG. 1. The Zener 102 is connected between the I/O pad or Vdd and the base of the BJT 100, the current path being completed by a resistor 104 connected between the base and ground. The arrangement of the bipolar device 100, 300, resistor 104, 304, and reference Zener 102 is shown in simplified form in FIG. 2, which shows an NPN BJT 100 arranged in an enhanced Zener clamp arrangement. The same reference numerals were retained for FIG. 2 as for FIG. 1 to identify the corresponding structures. FIG. 3 shows the layout for a BSCR 300 making use of a stacked diode arrangement 302 to provide the reference voltage, and also requiring a resistor 304 to complete the current path. It will therefore be appreciated that the additional reference device, whether it be a Zener or a diode or stacked diode arrangement, and the resistor consume a considerable amount of chip space.

SUMMARY OF THE INVENTION

According to the invention there is provided a method of controlling the breakdown voltage of a bipolar device, which includes a collector, a base, and an emitter, defining a collector breakdown region between the collector and the emitter, the method comprising injecting avalanche current into the collector breakdown region of the bipolar device. The avalanche current may be generated by a diode defined by providing an overlap of part of the base with part of the collector. The method may include forming the base by diffusing a base into a substrate or epitaxial material and forming the collector by implanting the collector in the substrate or epitaxial region and providing a base diffusion and collector implant overlap.

Further, according to the invention, there is provided a bipolar device with controllable breakdown voltage, comprising a bipolar device (e.g., an NPN BJT or BSCR device) that includes an emitter, a base, and a collector, wherein the base and collector partially overlap to form a p-n junction having a RESURF or low doped region. The collector may comprise a collector implant and the base may comprise a base diffusion formed in a substrate or epitaxial material. The collector implant may include a sub-collector, wherein the overlap with the base diffusion involves an overlap between the base diffusion and at least part of the sub-collector. The sub-collector may comprise an n-sinker and an n-buried layer (NBL), wherein the base diffusion overlap with at least part of the sub-collector involves an overlap with the sinker.

DETAILED DESCRIPTION OF THE INVENTION

The present invention provides for an intrinsic reference device in the form of a Zener-like diode that is formed by overlapping part of the base diffusion with at least part of the collector implant. In one embodiment, in which the collector implant is defined by a sub-collector involving a sinker and buried layer, the overlap is achieved by overlapping part of the base diffusion with the sinker, thereby in effect creating a low doped region in the sinker due to counter-doping.

Figure 4:
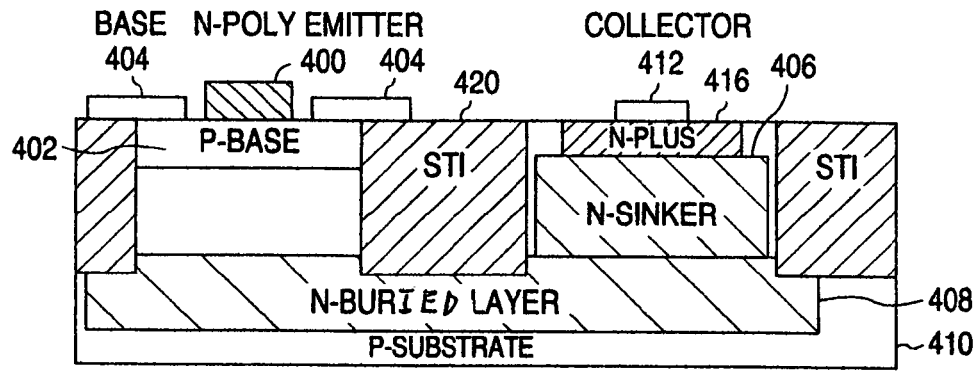
FIG. 4 shows a sectional side view of a prior art NPN BJT.
Figure 5:
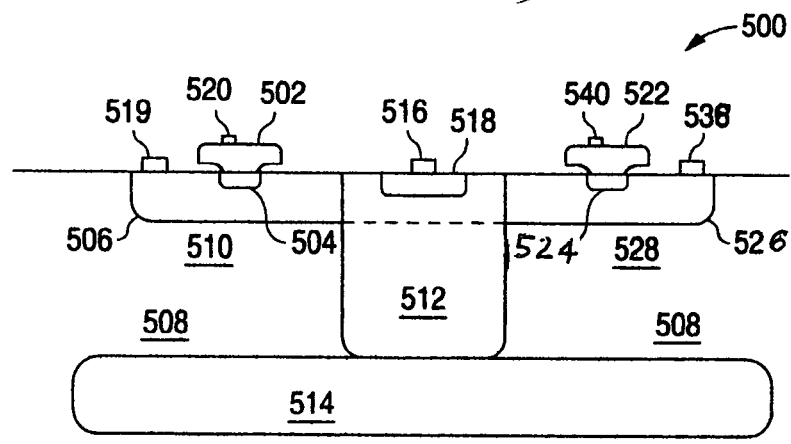
FIG. 5 shows a sectional side view of one embodiment of the invention.

This is best understood by comparing an NPN BJT embodiment of the invention as shown in FIG. 5 with a prior art NPN BJT as shown in cross section in FIG. 4.

The prior art device of FIG. 4 includes an n+ polysilicon emitter 400 formed on a p-base 402 that is provided with base contacts 404. The collector includes a sub-collector in the form of an n-sinker 406 and an n-buried layer (NBL) 408 formed in a p-substrate 410. The collector contact 412 connects to the collector 414 through an n+ region 416 and the sub-collector 406, 408. As shown in FIG. 4 the p-base 402 is isolated from the n+ region 416 and sub-collector 406, 408 by a shallow trench isolation (STI) region 420.

Figure 1:
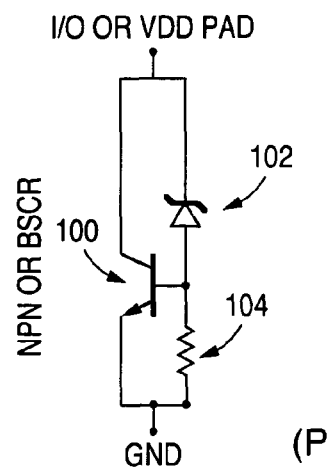
FIG. 1 is a schematic circuit diagram of a prior art NPN BJT with Zener reference device, FIG. 2 a simplified layout of the circuit of FIG. 1.
Figure 2:
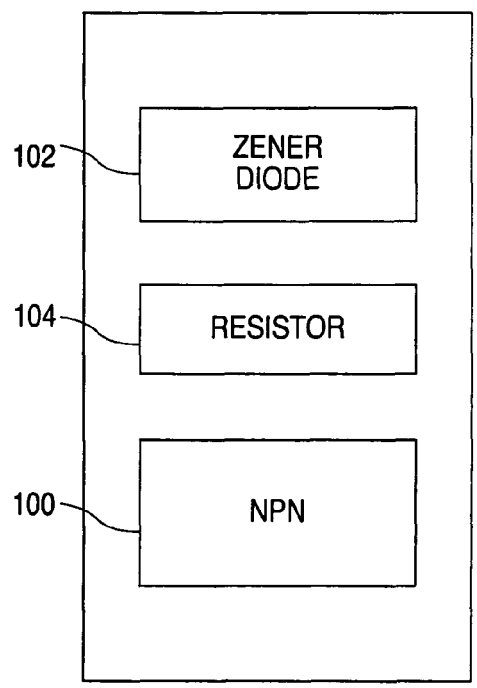
Figure 3:
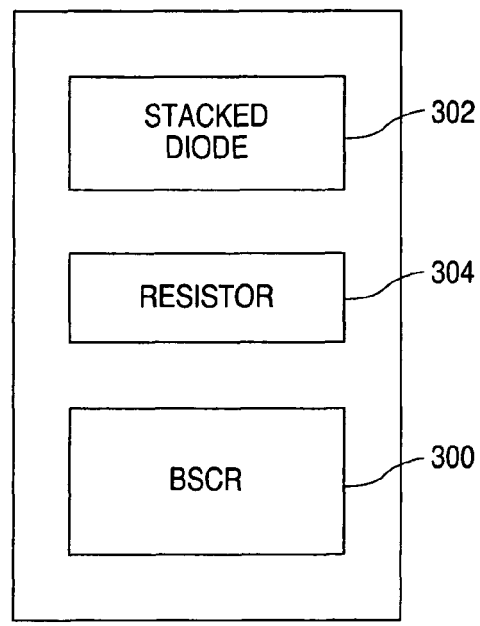
FIG. 3 shows a simplified layout of a prior art BSCR with stacked diode reference device.

In contrast, the NPN BJT of the invention shown in FIG. 5 does away with the STI region, thereby defining a Zener diode between the base diffusion and the collector implant. In particular, the structure 500 includes a first NPN BJT comprising an emitter poly 502 with an emitter region 504 formed in a p-base diffusion 506. The p-base diffusion 506 is in turn formed in an n-epitaxial layer 508 and includes two p+ regions (not shown) for contacting the base 506. The n-epitaxial layer defines the collector 510 beneath the base diffusion 506, and contact to the collector 510 is achieved by way of a collector implant or sub-collector comprising a sinker 512 and n-buried layer (NBL) 514. The collector contact 516 makes electrical contact with the sub-collector through an n+ diffusion 518. Also shown in FIG. 5 is the base contact 519 and emitter contact 520. In this embodiment a second NPN BJT is formed back-to-back with the first and includes an emitter poly 522 with an emitter region 524 formed in a p-base diffusion 526. The p-base diffusion 526 is again formed in the n-epitaxial layer 508. The n-epitaxial layer 508 also defines the collector 528 beneath the base diffusion 526, and contact to the collector 528 is achieved by way of the sub-collector implant comprising the sinker 512 and the n-buried layer (NBL) 514, as shown in FIG. 5. As mentioned above, the collector contact 516 makes electrical contact with the sinker 512 of the sub-collector through an n+ diffusion 518. Also shown in FIG. 5 is the base contact 538 for base diffusion 526, and emitter contact 540 for emitter poly 522. In accordance with the invention the collector implant defining the sub-collector overlaps the base diffusion. In particular the sinker 512 overlaps the base diffusion 506 of the first NPN BJT as well as the base diffusion 526 of the second NPN BJT. The result is a low doped or reduced surface electric field (RESURF) between the n+ diffusion 518 of the collector and the p-base diffusions 506, 526. Thus p-n junctions with Zener like characteristics are formed that inject carriers into the collector breakdown regions between the sinker 512 of the sub-collector and the emitters 504, 524. Thus the avalanche current is injected directly into the collector breakdown region rather than through the base electrode as is the case in the prior art structure of FIG. 1.

Figure 6:
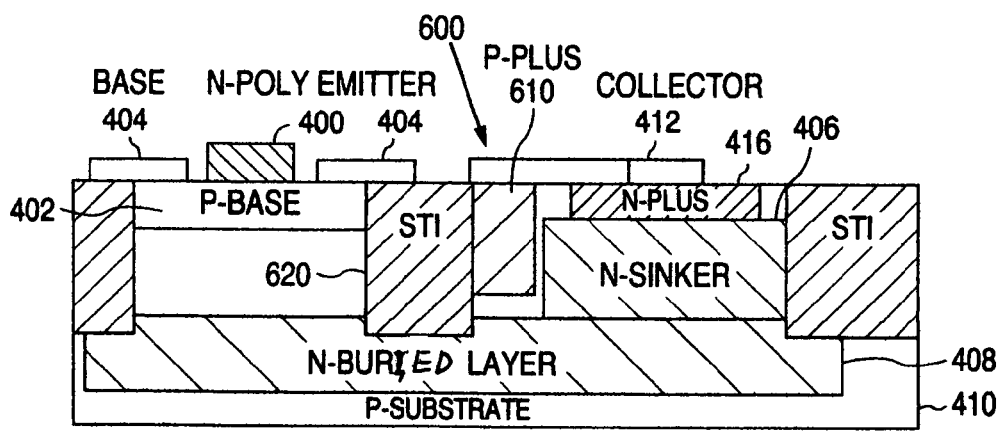
FIG. 6 shows a sectional side view of a prior art BSCR.
Figure 7:
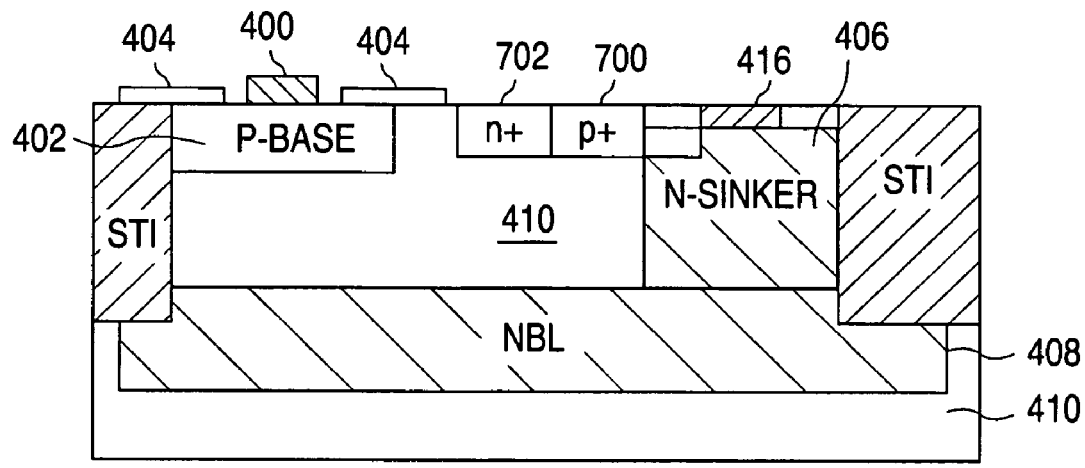
FIG. 7 shows a sectional side view of another embodiment of the invention.

FIG. 7 shows another embodiment of the invention, which comprises a BSCR with a reference device controlling the triggering of the bipolar device in the BSCR. This is best understood with reference to the prior art BSCR shown in FIG. 6. The prior art bipolar SCR or BSCR 600 shown in FIG. 6 is structurally similar to a BJT. Therefore similar elements to the BJT of FIG. 4 have been depicted using the same reference numerals. The BSCR, for instance, includes an n-poly emitter 400, a p-base 402 with base contacts 404, and a collector that includes a sub-collector in the form of an n-sinker 406 and an NBL 408 formed in a p-substrate 410. In addition to the NPN BJT elements, the BSCR includes a p+ region 610 that serves as the SCR p-emitter. As in the prior art BJT, a STI region is formed, which in this case is STI 620 located between the p+ region 610 and the p-base 402.

According to the invention, a Zener diode is again formed intrinsically. As shown in FIG. 7, in this embodiment, this is achieved by eliminating the STI 620 and providing a reverse biased p-n junction between the n-material of the n+ region 416 and n-sinker 406, and the p-material of the p+ region 700 formed in the p-substrate 410. In particular, the n+ region 416 and n-sinker 406 are partially blocked to define p+fingers 700 along the width of the structure. Also, instead of an isolation region such as a STI 620 (see FIG. 6 prior art), the present embodiment includes a floating n+ region 702 defining a blocking junction.

Figure 8:
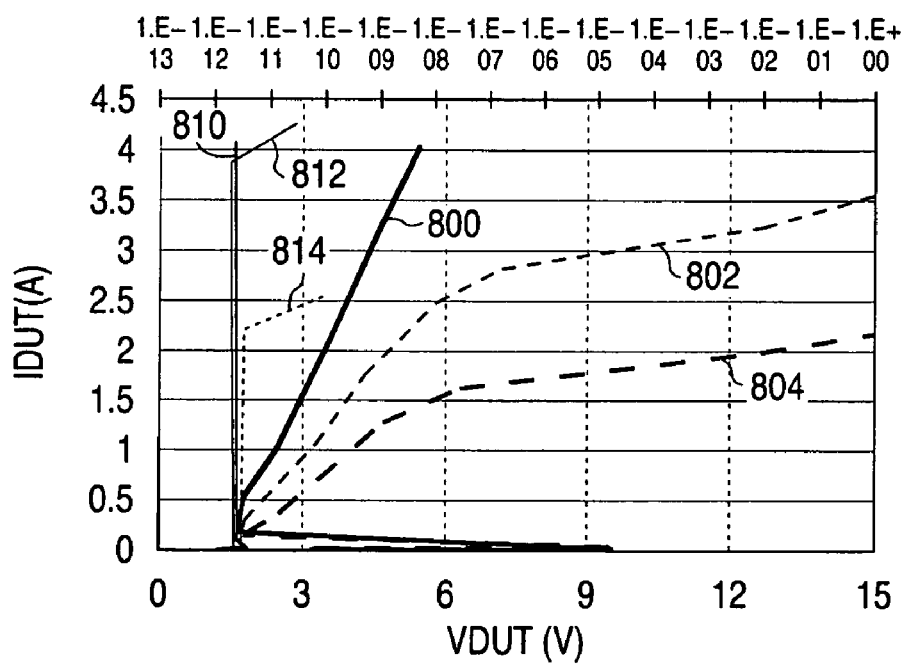
FIG. 8 shows I-V curves and leakage current curves as device current increases for BSCR devices of the invention having different finger widths.

The effect of including a control device in accordance with the invention is shown for a BSCR in FIG. 8. FIG. 8 shows current versus voltage curves for BSCRs of the invention having different width p+fingers 700 (curves 800, 802, 804), and corresponding leakage current curves at the changing currents for the different finger widths (curves 810, 812, 814). In particular curves 800 and 810 are for two fingers of 50 um width, curves 802, 812 are for two fingers of 25 um width, and curves 804, 814 are for two finger of 15 um width. As is seen from the curves 800, 802, 804, the triggering voltage changes as the finger width changes. Also, wider fingers result in a more robust BSCR clamp (see curves 810, 812, 814 in which curve 610 remains least effected as current through the device increases).

Figure 9:
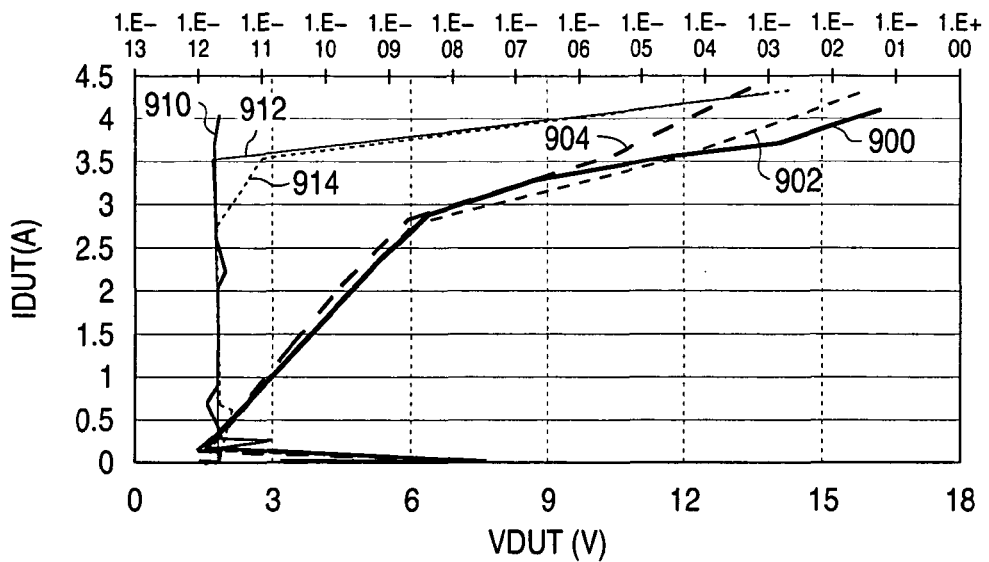
FIG. 9 shows I-V curves and leakage current curves as device current increases for BSCR devices of the invention having different collector-emitter spacings.

The BSCR device of the invention also shows that the spacing between the n+ regions of the emitter and the collector impact the triggering voltage and robustness, as is shown by the curves of FIG. 9. In particular, high current robustness increases with larger emitter-collector spacing (see curve 910 for a spacing of 3 um compared to curve 912 for a 2 um spacing and curve 914 for a 1 um spacing). The triggering voltage however also increases with increased emitter-collector spacing as is evident from curves 900 and 902 for a spacing of 3 um and 2 um respectively (having a triggering voltage of 7.6V) compared to curve 904 for a spacing of 1 um (having a triggering voltage of 5.4V).

Figure 10:
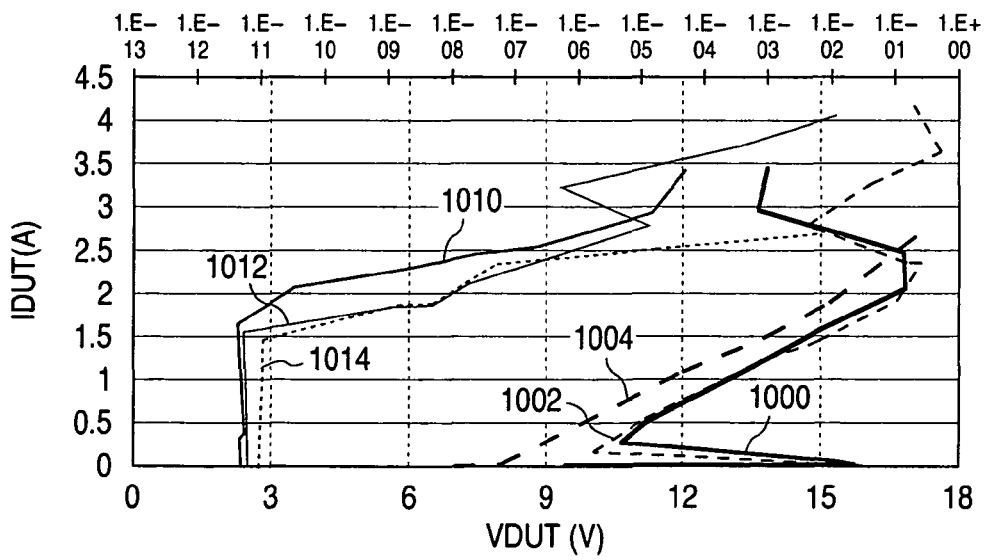
FIG. 10 shows I-V curves and leakage current curves as device current increases for NPN BJT devices of the invention having different collector-emitter spacings.

These effects due to changes in the emitter-collector spacing were also observed for NPN BJTs and are shown graphically in FIG. 10. As shown by curves 1004, 1002, 1000, as the spacing between the n+ regions of the emitter and collector are increased from 1 um to 2 um to 3 um, the triggering voltage increases. On the other hand these increases in emitter-collector spacing have the benefit of increased high current robustness as shown by curves 1014, 1012, 1010, respectively. Thus by varying the emitter-collector spacing or the finger widths or both, the triggering voltage and robustness of the device can be adjusted.

While the above description dealt with specific embodiments, the invention is not limited to these examples but can be implemented in different ways without departing from the scope of the invention as defined by the claims.

That is claimed is:

1. An NPN bipolar device with controllable breakdown voltage, comprising a bipolar device that includes an n+ polysilicon emitter, a p-type base, and a collector with sub-collector, the sub-collector including an n-sinker that is arranged to partially overlap the p-type base to form a p-n junction having a RESURF or low doped region defining a finger where the n-sinker overlaps the p-type base to define an intrinsic Zener diode junction.

* * * * *